US006328905B1

(12) United States Patent
Lebowitz et al.

(10) Patent No.: US 6,328,905 B1
(45) Date of Patent: Dec. 11, 2001

(54) RESIDUE REMOVAL BY $CO_2$ WATER RINSE IN CONJUNCTION WITH POST METAL ETCH PLASMA STRIP

(75) Inventors: Joseph Lebowitz; Laura E. Faulk, both of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/372,895

(22) Filed: Aug. 12, 1999

(51) Int. Cl.$^7$ .............................. C23F 1/00; H01L 21/302; B44C 1/22
(52) U.S. Cl. ................................. 216/67; 216/57; 134/1.1; 134/1.2; 134/1.3; 438/725; 252/79.4
(58) Field of Search ........................... 216/67, 57; 134/1, 134/1.1, 1.2, 1.3; 438/725; 252/79.4

(56) References Cited

U.S. PATENT DOCUMENTS

| | | | |
|---|---|---|---|
| 5,814,155 | * | 9/1998 | Solis et al. ................................. 134/1 |
| 5,863,348 | * | 1/1999 | Smith, Jr. et al. ...................... 134/18 |
| 5,925,577 | * | 7/1999 | Solis ..................................... 438/725 |
| 5,980,770 | * | 11/1999 | Ramachandran et al. ............. 216/67 |
| 6,156,661 | * | 12/2000 | Small .................................... 438/692 |
| 6,162,733 | * | 12/2000 | Obeng .................................. 438/706 |
| 6,218,084 | * | 4/2001 | Yang et al. ........................... 430/329 |

OTHER PUBLICATIONS

Semitool; "Corrosion Issues in Solven Processing"; all pages; Feb. 1996.*
Stanley Wolf and Richard N. Tauber; *Silicon Processing for the VLSI Era; Vol. 1: Process Integration*, pp. 518–519; 1986.

Semitool; *Corrosion Issues in Solvent Processing*; all pages; Feb. 1996.

David Rennie et al.; *Testing of the $CO_2$ Sparge Kit on the Semitool SST–Part II*; all pages; Oct. 1998.

J. F. Christaud et al., *Solvent Free Plasma Removal of Etch Polymers in High–Volume Production*, all pages, 1998.

Jean–Francois Christaud et al., *Solvent–free Plasma Removal of Etch Polymers in High–Volume Production*, all pages, May 1998.

J. F. Christaud, *EKC265 Elimination & Back–End Offline Polymer Removal*, all pages, 1999.

Jean–Francois Christaud et al., *Solvent–free plasma removal of etch polymers*, all pages, Mar. 1999.

* cited by examiner

Primary Examiner—Randy Gulakowski
Assistant Examiner—Shamim Ahmed
(74) Attorney, Agent, or Firm—Timothy M. Honeycutt

(57) ABSTRACT

Methods of removing resist residues from semiconductor workpiece surfaces are provided. In one aspect, a method of removing resist from a surface of a workpiece is provided that includes the steps of exposing the workpiece to a plasma and rinsing the workpiece with $CO_2$ and water in a processing chamber to dissolve the resist. Reliance on post plasma strip solvent rinses for resist removal is eliminated. The combination of $CO_2$ with post-plasma strip water rinse increases the solubility and thus the removal rate of resist residues.

24 Claims, 5 Drawing Sheets

RESIDUE REMOVAL BY CO₂ WATER RINSE IN CONJUNCTION WITH POST METAL ETCH PLASMA STRIP

BACKGROUND OF THE INVENTION

1. Field of the Invention

This invention relates generally to semiconductor fabrication, and more particularly to a method of removing residues from etched metallic surfaces.

2. Description of the Related Art

The fabrication of multi-level metallization structures in integrated circuit processing involves the alternating and sequential fabrication of various metal and interlevel dielectric layers. Interconnections between adjacent metal layers are ordinarily established by means of a plurality of contacts or local interconnects extending through the interlevel dielectric layers that separate the metal layers.

The fabrication of metal interconnect layers involves the sequential blanket deposition of metallic material, lithographic resist patterning, and etch to remove the unmasked portions of the deposited metallic layer. Following the etch, the resist is stripped and the remaining surfaces cleansed to remove any residual resist material remaining after the stripping process. Many conventional post metal etch stripping processes have traditionally used a plasma strip followed by a solvent cleaning process. The use of amine based solvent chemistry as a post metal etch cleaning agent has long been a standard solvent cleaning technique used in the semiconductor industry. Conventional processes have employed both hydroxyl and primary amines as cleansing solvents.

Solvent stripping processes provided adequate residue removal in earlier fabrication processes involving relatively large geometries. However, more modern processes involving shrinking line width and device designs incorporating misalignments between metal interconnect layers and underlying contact structures have exposed certain shortfalls associated with solvent based chemistry. One such shortcoming is the propensity for traditional solvent based chemistries to etch the metal films exposed by both the plasma strip and solvent stripping processes. The undesirable erosion of both the overlying metal interconnect structures as well as the exposed portions of contact structures, such as tungsten plugs, is the product of both purely chemical and electrochemical mechanisms. The chemical erosion of the metallic interconnect and contact structures is largely the result of the chemical interaction of the residual OH molecules generated by hydroxyl amine solvents, although primary amines can result in a chemical erosion as well. The free hydroxides cause the pH of the solvents to be relatively high. The electrochemical attack of underlying contact structures is due to an electrogalvanic reaction that occurs as a result of charges stored in conducting layers positioned beneath the contact structures during the plasma etching of the overlying metallic interconnect layer. The subsequent use of an amine based solvent triggers the electrogalvanic reaction that can significantly erode the exposed portions of the contact structures that connect the overlying interconnect layer to the underlying conducting layers.

The use of a water and carbon dioxide post solvent strip rinse following solvent cleaning has been employed in some conventional resist stripping processes to ameliorate the potentially damaging effects of amine based solvent chemistry. The goal of utilizing $CO_2$ and water is to reduce the pH of the water during the water rinse process. Although this technique has shown some promise in alleviating some of the chemical and electrochemical processes that can erode the metal interconnect and underlying contact structures, the potential for such unattended erosion of those conducting structures has not been completely eliminated.

Aside from the unwanted chemical effects, the use of solvent chemistry as a cleansing agent involves manufacturing costs. The solvent rinse process consumes time and thus can constitute a significant limit on throughput. Furthermore, solvent consumption can be significant as solvent recycling is problematic.

One manufacturer of resist stripping tools has turned away from solvent based chemistry in favor of a solventless cleaning process. In this conventional process, one or more plasma strip processes are employed following metal etch and the last plasma strip process is followed by a water rinse. The goal of this alternate process is to rely on the effectiveness of the plasma strip and water rinse process to remove as much resist residue as possible without the incorporation of solvent based chemistry. The difficulty with this alternate process is that resist residues frequently remain on the metal interconnect structures following the plasma strip and water rinse process. The presence of resist residues on the remaining metal interconnect surfaces following plasma strip and water rinse is thought to be the result of unavoidable variations in the kinetics of the plasma strip process. The behavior of the particles within the plasma is influenced by a large number of different mechanisms, each of which is subject to variation, such as the electric and magnetic fields acting on the plasma, the pressure within the chamber, the temperature of both the plasma and the impacted surfaces, as well as the myriad of various chemical reactions that frequently take place within and around the plasma.

The present invention is directed to overcoming or reducing the effects of one or more of the foregoing disadvantages.

SUMMARY OF THE INVENTION

In accordance with one aspect of the present invention, a method of removing resist from a surface of a workpiece is provided that includes the steps of exposing the workpiece to a plasma and rinsing the workpiece with $CO_2$ and water in a processing chamber to dissolve the resist. The water and dissolved resist are displaced from the workpiece.

In accordance with another aspect of the present invention, a method of removing resist from an etched metal layer on a workpiece is provided. The metal layer is exposed to a plasma and spin rinsed with $CO_2$ and water in a processing chamber.

In accordance with another aspect of the present invention, a method of removing resist from an etched metal layer on a workpiece is provided. The metal layer is exposed to a plasma containing $CF_4$, nitrogen and hydrogen and spin rinsed with a combination of $CO_2$ and liquid water in a processing chamber for a first period to dissolve the resist. The exposure of the water to the workpiece is discontinued and the workpiece is rotated for a second period to remove the water and dissolved resist therefrom.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
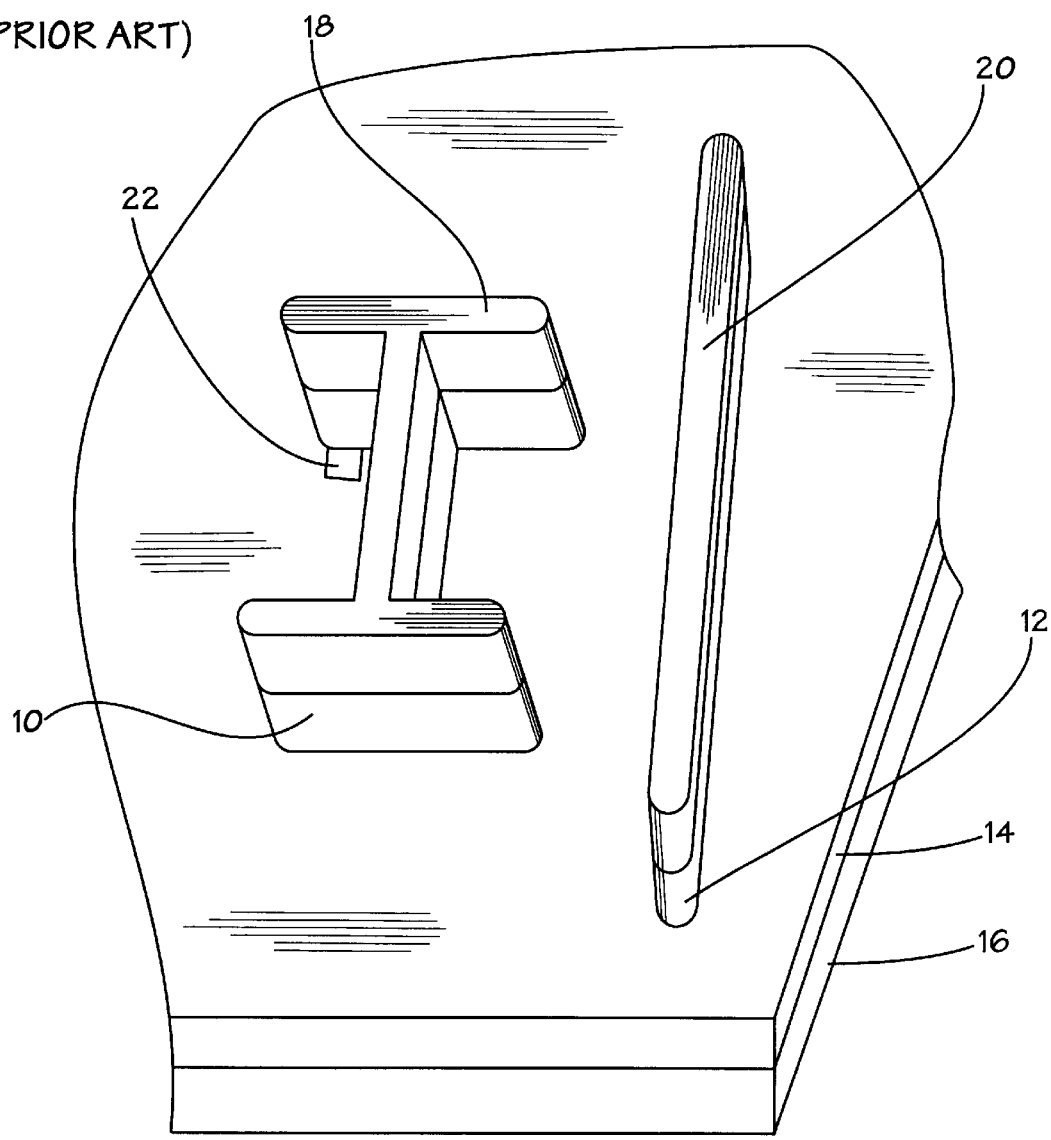
FIG. 1 is a pictorial view of two interconnect structures just after metal etch but before conventional resist stripping.
Figure 2:
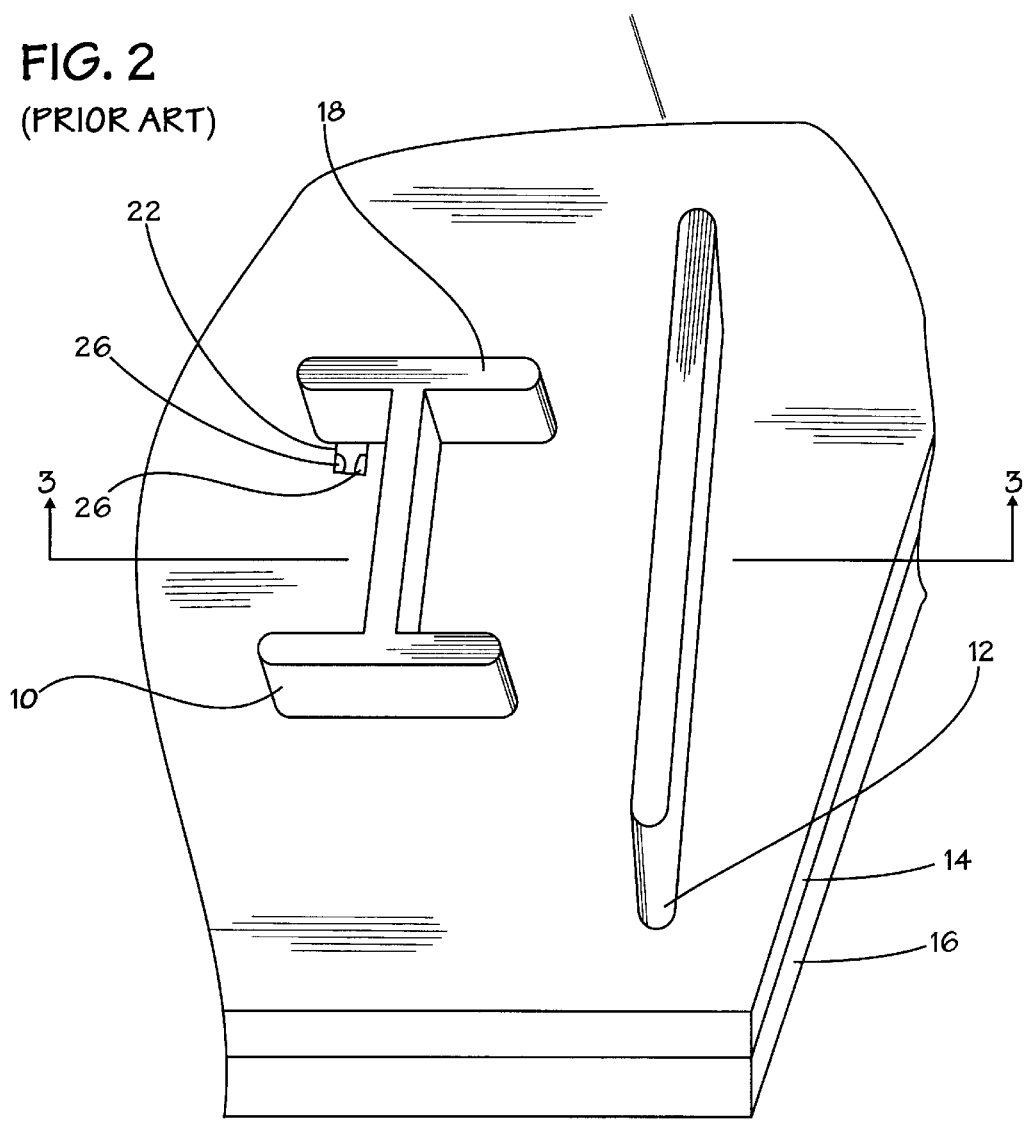
FIG. 2 is a, pictorial view like FIG. 1 depicting the interconnect structures following conventional resist stripping.
Figure 3:
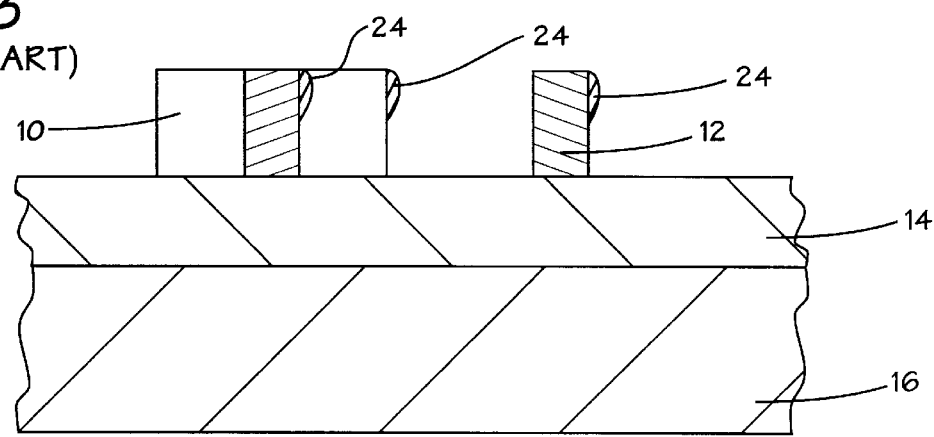
FIG. 3 is cross-sectional view of FIG. 2 taken at section 3—3.

In the drawings described below, reference numerals are generally repeated where identical elements appear in more than one figure. Turning now to the drawings, and in particular to FIGS. 1–3, an exemplary conventional post-metal etch stripping process will be described. FIG. 1 depicts a pictorial view of two metal interconnect structures 10 and 12, which are portions of a larger interconnect layer that is fabricated on an interlevel dielectric layer 14. The interlevel dielectric layer 14 is, in turn, fabricated on a semiconductor substrate 16. FIG. 1 is a depiction of the interconnect structures 10 and 12 just after metal etch but before resist stripping. Accordingly, photomask structures 18 and 20 respectively overlie the interconnect structures 10 and 12. Prior to the etch definition of the interconnect structures 14 and 16, the photomask structures 18 and 20 are patterned into the desired shapes for the interconnect structures 14 and 16. The interconnect structure 10 overlies a metallic contact 22 that is formed in a via in the interlevel dielectric layer 14. As commonly occurs in conventional metallization in semiconductor processing, a portion of the contact 22 is exposed following the etch definition of the interconnect structures 10 and 12.

Referring now to FIGS. 2 and 3, the photomask structures 18 and 20 depicted in FIG. 1 are stripped in anticipation of the application of additional interlevel dielectric and metallization layers. FIG. 2 is a pictorial view like FIG. 1 and FIG. 3 is a sectional view of FIG. 2 taken at section 3—3. An in-situ plasma strip is performed using an etchant specie that is suitable for plasma stripping the particular resist material. The plasma strip process itself does not remove all of the resist material. Rather, residues 24 remain on the interconnect structures 10 and 12 that consist primarily of conglomerates of resist and the products from chemical reactions between the resist material and the etchant specie used during the plasma strip. The residues 24 are depicted only on the sidewalls of the interconnect structures for simplicity of illustration. However, the skilled artisan will appreciate that resist residue following metal etch may be much more widespread. To eliminate the residues 24, a solvent strip is next performed. In many conventional solvent stripping processes, an amine based solvent is exposed to the interconnect structures 10 and 12. As noted above, traditional amine based solvent stripping can lead to etching not only of the interconnect structures 10 and 12, but also to chemical and electrochemical attack of underlying metallization structures, such as the contact 22. This can lead to the formation of pits 26 in the underlying contact 22 as shown in FIG. 2.

In lieu of solvent stripping following initial plasma strip, another post plasma strip cleaning process used by some semiconductor manufacturers to eliminate the residues 24. Although this technique alleviates the undesirable metal problems associated with traditional solvent based stripping processes, the problem of small residues, particularly those forming on the vertical sidewalls of interconnect structures, such as the residues 24 depicted in FIG. 3, remains problematic. The propensity for the residues 24 to remain on the surfaces of the interconnect structures 10 and 12 even after a multiple plasma strip cleansing process is thought to be the result of unavoidable variations in the kinetics of the plasma used during the multiple plasma strip process.

Figure 4:
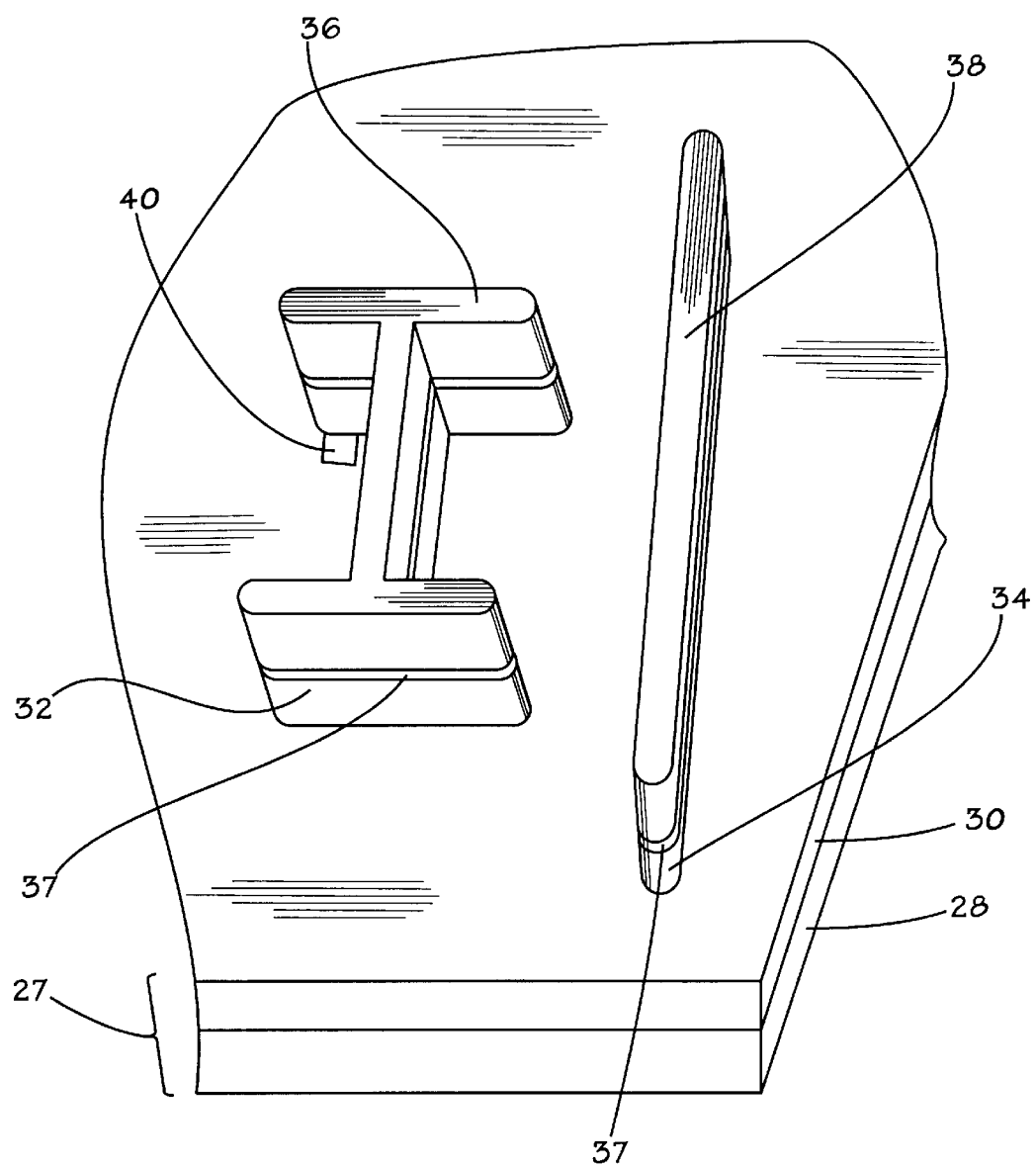
FIG. 4 depicts the metal etch of a pair of metal interconnect layers on a semiconductor substrate in an exemplary process in accordance with the present invention.

An exemplary process flow in accordance with the present invention may be understood by referring now to FIGS. 4, 5, 6 and 7, and initially to FIG. 4. FIG. 4 is a pictorial view of a semiconductor workpiece 27 that consists of a semiconductor substrate 28 and an interlevel dielectric layer 30 formed thereon. The workpiece 27 may be a wafer or other type of semiconductor fabrication workpiece. The substrate 28 may be composed of n-doped silicon, p-doped silicon, silicon-on-insulator or other suitable substrate materials. The interlevel dielectric layer 30 and may be composed of a variety of insulating materials commonly used for interlevel dielectric layers, such as, for examples, TEOS, thermal and plasma enhanced oxides, silicon nitride, boro-phospho-silicate-glass, or the like. Well-known CVD techniques may be used to deposit the layer 30. In an exemplary embodiment, the interlevel dielectric layer 20 is composed of TEOS and is applied using CVD to a thickness of about 0.5 to 2.5 $\mu$m.

Two metal interconnect structures 32 and 34 are positioned on the interlevel dielectric layer 30 and capped by an anti-reflective coating 37. The anti-reflective coating 37 may be composed of TiN or other anti-reflective coatings appropriate for the lithography and resist optics utilized. FIG. 4 depicts the metal interconnect structures 32 and 34 just after etch definition but prior to stripping of photomask structures 36 and 38, which overlie the anti-reflective coating 37 and the interconnect structures 32 and 34. The interconnect structures 32 and 34 may be isolated local interconnects or small portions of a much larger interconnect layer, and may be fabricated in a myriad of shapes. Accordingly, the shapes of the interconnect structures 32 and 34 depicted are intended to be merely illustrative.

Prior to the metal etch, bulk metal is blanket deposited on the interlevel dielectric layer 30. Thereafter, resist is applied and patterned to yield the photomask structures 36 and 38, and the exposed metal is etched to yield the structures 32 and 34. The interconnect structures 32 and 34 may be composed of a variety of materials commonly used for metallization layers, such as, for example, aluminum, aluminum combined with about 1 to 2% copper, or other suitable materials. The thickness of the interconnect structures 32 and 34 is largely a matter of design discretion. In an exemplary embodiment, the structures 32 and 34 have a thickness of about 2500 to 10,000Å. The choice of resist type and brand is largely a matter of design discretion. In an exemplary embodiment, a Shipley 955 resist is applied to a thickness of about 8,000 to 10000Å and patterned into the desired shapes for the subsequently formed interconnect structures 32 and 34 using well known lithographic patterning techniques.

The interconnect structures 32 and 34 are patterned via a dry anisotropic plasma etch using $Cl_2$ and HBr or other suitable combinations for etching aluminum. If the etch species selected for the metal layer will not attack the antireflective coating 37, an additional etch chemistry may be used as needed. The etch may be performed in an Applied Materials DPS etch tool or the like.

A large plurality of contact structures are formed through the interlevel dielectric layer 30 to establish electrical contact with various circuit elements which are not visible in FIG. 4. The interconnect structure 32 is fabricated to overlie one of these contact structures 40. To illustrate one of the benefits of the process of the present invention, the contact structure 40 is depicted with a portion thereof exposed following the etch definition of the interconnect structures 32 and 34. As noted above, the exposure of underlying contact structures following metal etch is a common occurrence in small geometry fabrication processes.

Following the etch definition of the interconnect structures 32 and 34, an in-situ plasma strip is performed in the etch tool. The particular protocol for the in-situ strip of the resist structures 36 and 38 is largely a matter of design discretion and will depend upon factors such as the tool used for the etch, and the material to be etched, among others. In an exemplary embodiment, a three step in-situ plasma strip is performed. The first step is performed for about 15 seconds at a pressure of about 2 torr and a plate power of about 1400 watts. The chamber temperature is about 250° C. and the plasma mixture includes about 1400 sccm of $O_2$, about 300 sccm of $H_2O$ vapor and about 40 sccm of $CF_4$. In the second step the same time, power and pressure values are used, but the plasma mixture is changed to about 700 sccm of $H_2O$ vapor and little or no $O_2$ or $CF_4$. In the third step, the same time, power and pressure values are used, but the plasma mixture is changed to about 3500 sccm $O_2$ and about 300 sccm $H_2O$ vapor with little or no $CF_4$. Steps two and three are repeated four times for a total of nine process steps.

Following the in-situ plasma strip, the workpiece 27 undergoes an additional plasma strip process in a Mattson ICP plasma strip tool or similar plasma strip tool. The plasma strip is carried out at a pressure of about 2.5 torr, a plate power setting of about 700 watts, and with a gas mixture consisting of $CF_4$, nitrogen and hydrogen. In an exemplary embodiment, the nitrogen and hydrogen combination consists of forming gas ($N_2$ and about 4% $H_2$). The appropriate volumes of $CF_4$ and forming gas will depend upon parameters, such as the type of tool and the materials to be removed. In an exemplary embodiment, the gaseous mixture consists of about 200 sccm of $CF_4$ and about 2000 sccm of forming gas. The duration of the plasma strip is dependent upon the type of processing that follows. A rinse is performed following the plasma strip. The duration of the plasma strip is dependent upon the constituents used to rinse to perform the subsequent rinse process. As described more fully below, the rinse advantageously consists of liquid deionized $H_2O$ and gaseous $CO_2$. Using that rinse formula, the plasma strip may be performed for about 50 to 70 seconds. However, if an ordinary deionized water rinse is used, the plasma strip may be performed for about 110 seconds.

Figure 5:
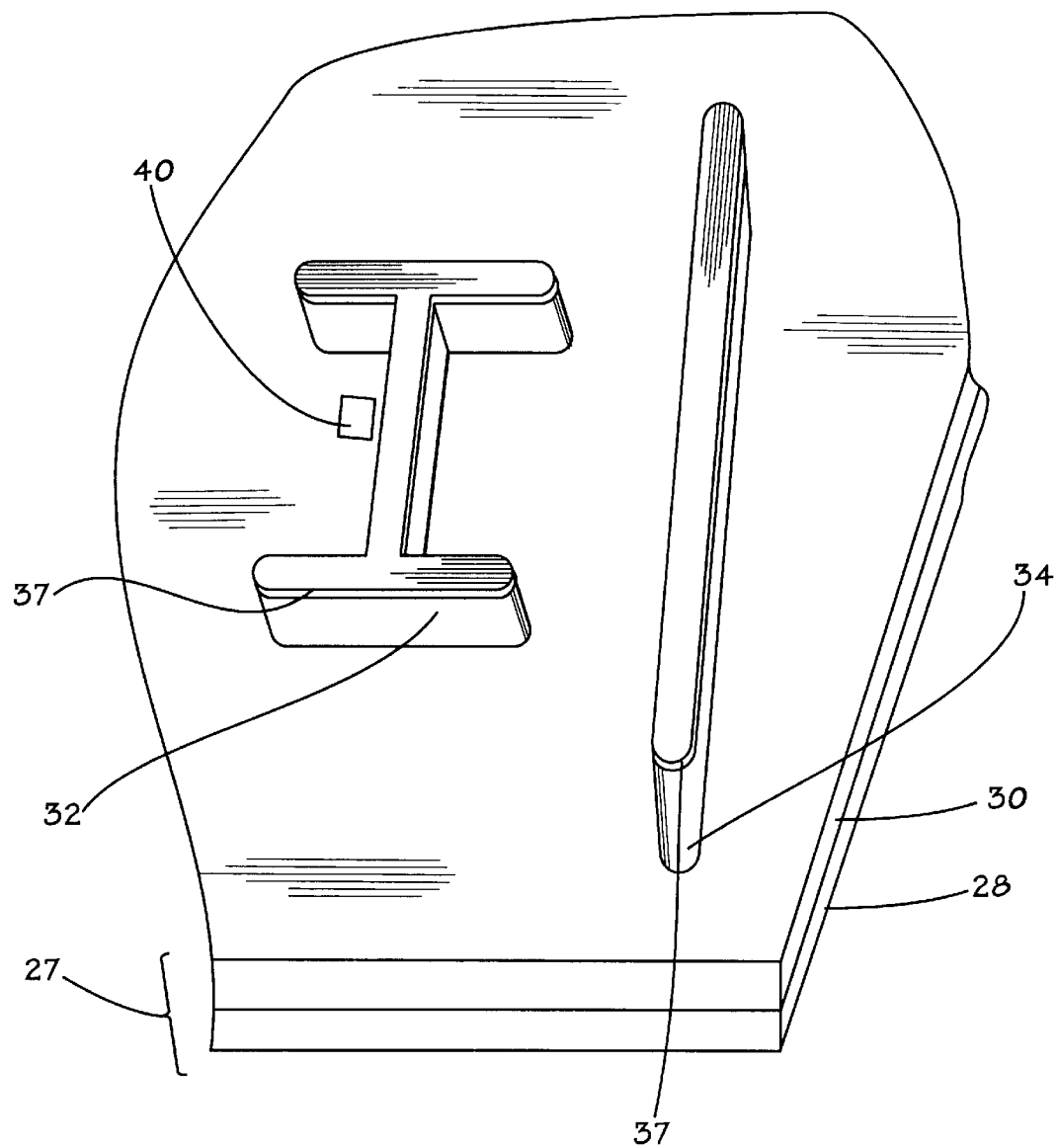
FIG. 5 is a pictorial view like FIG. 4 depicting the removal of photomask structures from the metal interconnect structures via plasma strip in accordance with the present invention.
Figure 6:
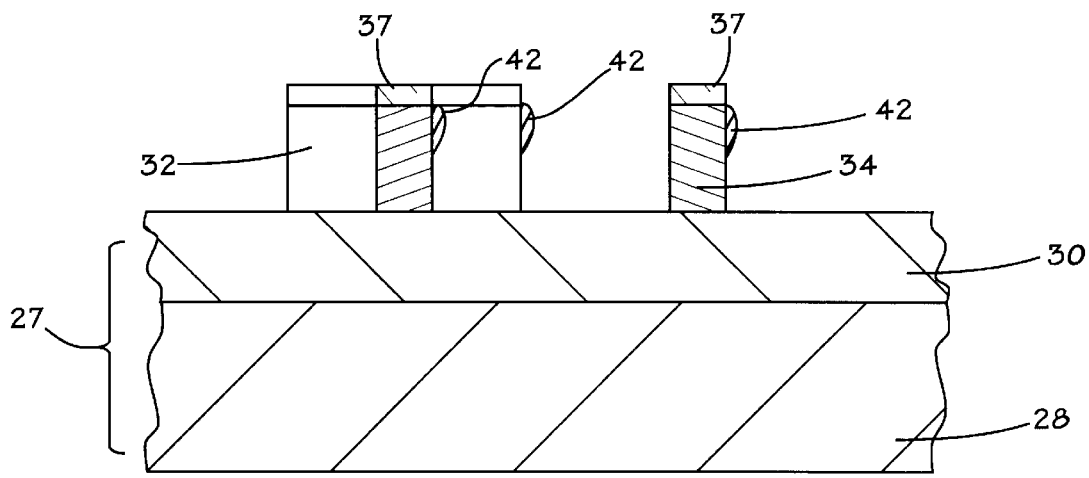
FIG. 6 is a cross sectional view of FIG. 5 taken at section 6—6 in accordance with the present invention.

The combination of the in-situ and subsequent dedicated plasma strip processes removes most of the photomask structures 36 and 38 depicted in FIG. 4, leaving the exposed anti-reflective coating and underlying interconnect structures 32 and 34 as shown in FIG. 5. However, as shown in FIG. 6, which is a cross-sectional view of FIG. 5 taken at section 6—6, it is anticipated that some residues 42 of the photomask structures 36 and 38 will remain even after the two plasma strip processes.

Figure 7:
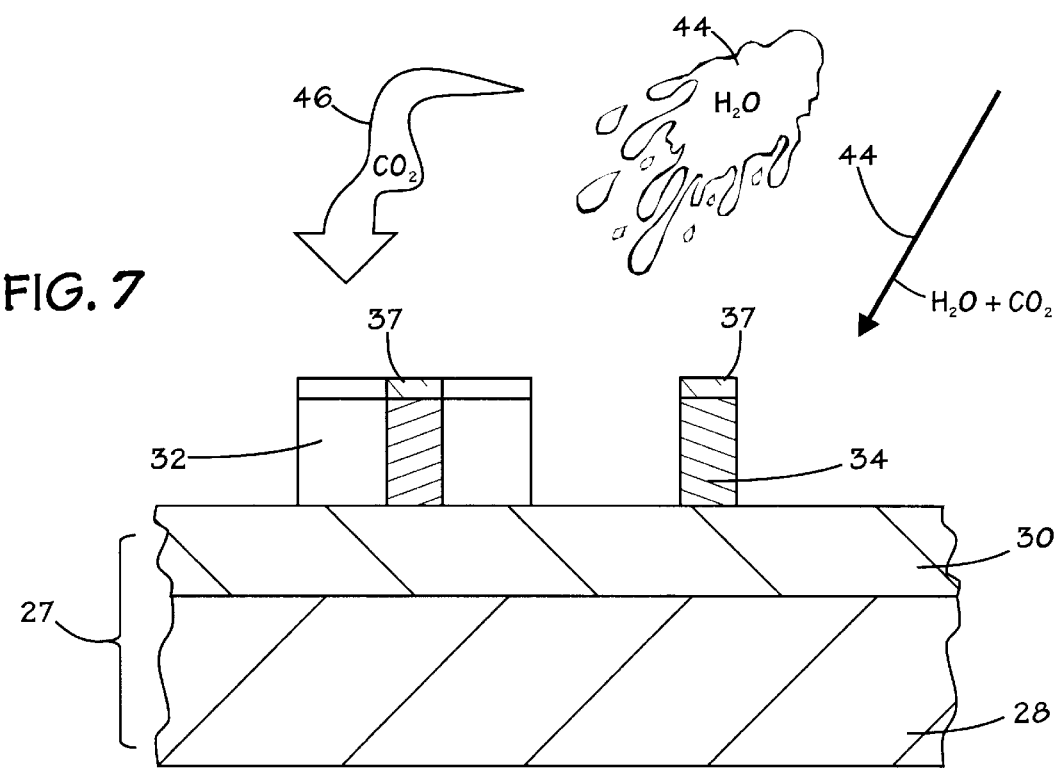
FIG. 7 is a cross sectional view like FIG. 6 depicting the $H_2O$ and $CO_2$ rinse process subsequent to plasma strip to remove resist residues in accordance with the present invention.

Referring now to FIG. 7, the residues 42 may be removed by performing a deionized water rinse with $CO_2$ mixing. A variety of techniques may be used in accordance with the present invention to rinse the workpiece 27 with $CO_2$ mixed deionized water. In one exemplary embodiment, a spin rinse process is used wherein the workpiece 27 is sprayed with $CO_2$ mixed deionized water and rotated to displace the water and dissolved residue 42. Initially, a manifold in the water rinse tool (not shown) is provided with a charge of $CO_2$. Gaseous $CO_2$ is pumped into the manifold at about 2.5 liters/minute for about 10 seconds and then deionized water is also introduced into the manifold. The appropriate $CO_2$ flow rate will depend on the rinse tool used. The workpiece 27 is next subjected to a series of spin rinses in a rinse chamber during which $CO_2$ mixed liquid deionized water is sprayed thereon as represented by the arrow 44. Although the water is dispensed as a liquid, it is anticipated that there will also be a nominal percentage of vapor phase water contacting the workpiece 27.

Experiment has shown that better removal of the residues 42 is achieved by using a plurality of sequenced spin cycles instead of one or a few longer duration spin cycles. In an exemplary embodiment, the substrate 28 is rotated at about 50 rpm for about 1 minute, then at about 600 rpm for about 4 minutes, then at about 50 rpm for 1 minute, then again at about 600 rpm for 4 minutes, and finally at about 50 rpm for 30 seconds. Carbon dioxide mixed water is continuously deposited on the substrate 28 during these high and low rpm spin cycles. Following the wet spin rinse cycles, a dwell is performed. The workpiece 27 is rotated at about 35 rpm for about 2 seconds.

The low rpm spin cycles enable the exposed surfaces of the workpiece 27 to be saturated with $H_2O$ combined with $CO_2$, and the higher rpms spin cycles act to eject $H_2O$ and dissolved portions of the residues 42. The $CO_2$ increases the solubility of the residues 42 in water, thus enabling the residues 42 to be more readily removed from the interconnect structures 32 and 34 during the rinse. As shown in FIG. 7, the performance of the $H_2O$ and $CO_2$ rinse process following the second plasma strip results in the removal of the residues 42 depicted in FIG. 6.

Although pH manipulation is not necessary since the process of the present invention does not use hydroxyl amine or other solvents which can lead to very basic solutions, it is anticipated that the incorporation of $CO_2$ will lower the pH of the rinse water. A pH range of about 3.5 to 5.5 is anticipated.

In the illustrated embodiment, the rinse water and the $CO_2$ are premixed prior to delivery to the workpiece 27. Alternatively, the $CO_2$ and water may be delivered to the workpiece 27 as separate streams, respectively designated 46 and 48, wherein mixing occurs in the rinse chamber.

Following the deionized water and $CO_2$ rinse, a nitrogen purge is performed. The workpiece 27 is initially rotated at about 35 rpm for about 10 seconds followed by a 2 minute and 30 second cycle at about 1200 rpm. The nitrogen is heated to about 185° C. A final six minute cycle is performed at about 600 rpm with an antistatic unit of the tool (not shown) activated.

In an alternate exemplary embodiment in accordance with the present invention, the $CO_2$ mixed water rinse may be performed by immersing the workpiece 27 in a bath of $CO_2$ mixed deionized water. The $CO_2$ may be bubbled into the water bath prior to or after the workpiece 27 is immersed therein. Following immersion in the $CO_2$ mixed deionized water bath, the workpiece 27 may be rotated or otherwise moved to displace any remaining water and dissolved residue 42. Alternatively, the workpiece 27 may be exposed to a liquid that readily evaporates, such as vapor phase isopropyl alcohol or the like, to displace the remaining water and dissolved residue 42.

The skilled artisan will appreciate that the process in accordance with the present invention yields improved removal of resist residues following metal etch. Use of solvent rinses and the attendant risks to conductor structures are eliminated without comprising device quality. Throughput is increased and material costs are decreased.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of removing resist from a surface of a workpiece, comprising:
    exposing the workpiece to a plasma;
    rinsing the workpiece with $CO_2$ and water in a processing chamber to dissolve the resist, the rinsing being performed without prior solvent stripping of the resist; and
    displacing the water and dissolved resist from the workpiece.

2. The method of claim 1, wherein the plasma comprises $CF_4$, nitrogen and hydrogen.

3. The method of claim 1, wherein the workpiece is exposed to a flow of gaseous $CO_2$ and a flow of liquid water.

4. The method of claim 3, wherein the water is sprayed onto the workpiece.

5. The method of claim 1, wherein the $CO_2$ and water are premixed prior to exposure to the workpiece.

6. The method of claim 1, wherein the workpiece is rinsed by immersion in a bath of water mixed with $CO_2$.

7. The method of claim 6, wherein the $CO_2$ and water are premixed before the workpiece is immersed in the bath.

8. The method of claim 1, wherein the water is displaced by rotating the workpiece.

9. The method of claim 8, wherein the workpiece is rotated prior to and during exposure to the water and $CO_2$.

10. The method of claim 8, wherein the water and $CO_2$ are continually exposed to the workpiece while the workpiece is rotated through a first cycle and not exposed to the water while the workpiece is rotated through a second cycle and dried.

11. The method of claim 1, wherein the surface comprises a metal.

12. The method of claim 11, wherein the metal comprises aluminum.

13. The method of claim 1, wherein the water and dissolved resist are displaced by exposing the workpiece to a liquid capable of rapid evaporation.

14. The method of claim 1, comprising purging the processing chamber with nitrogen after rinsing the workpiece.

15. A method of removing resist from an etched metal layer on a workpiece, comprising:
    exposing the metal layer to a plasma; and
    spin rinsing the metal layer with $CO_2$ and water in a processing chamber, the spin rinsing being performed without prior solvent stripping of the resist.

16. The method of claim 15, wherein the plasma comprises $CF_4$, nitrogen and hydrogen.

17. The method of claim 15, wherein the water is sprayed onto the workpiece.

18. The method of claim 17, wherein the $CO_2$ is mixed with the water before the water is exposed to the workpiece.

19. The method of claim 15, wherein the metal comprises aluminum.

20. The method of claim 15, comprising purging the chamber with nitrogen after exposing the workpiece to the $CO_2$ and water.

21. A method of removing resist from an etched metal layer on a workpiece, comprising:
    exposing the metal layer to a plasma containing $CF_4$, nitrogen and hydrogen;
    spin rinsing the metal layer with a combination of $CO_2$ and liquid water in a processing chamber for a first period to dissolve the resist; and
    spinning the workpiece for a second period to remove the water and dissolved resist therefrom.

22. The method of claim 21, wherein the $CO_2$ is mixed with the water before the water is exposed to the workpiece.

23. The method of claim 21, wherein the metal comprises aluminum.

24. The method of claim 21, comprising purging the chamber with nitrogen after exposing the workpiece to the $CO_2$ and water.

* * * * *